United States Patent

Norstrom et al.

[11] Patent Number: 6,163,446
[45] Date of Patent: Dec. 19, 2000

[54] PROTECTIVE CIRCUIT

[75] Inventors: Hans Norstrom, Solona; Jonas Jonsson, Sundbyberg, both of Sweden

[73] Assignee: Telefonaktiebolaget LM Ericsson, Stockholm, Sweden

[21] Appl. No.: 09/141,598

[22] Filed: Aug. 28, 1998

[30] Foreign Application Priority Data

Sep. 2, 1997 [SE] Sweden .................................. 9703160

[51] Int. Cl.[7] ...................................................... H02H 3/22
[52] U.S. Cl. ............................ 361/111; 361/56; 361/91.1; 361/91.5
[58] Field of Search ................................. 361/56, 91, 111, 361/91.1, 91.2, 91.5; 257/355–362

[56] References Cited

U.S. PATENT DOCUMENTS

| | | | |
|---|---|---|---|
| 4,476,476 | 10/1984 | Yu et al. . | |
| 4,875,130 | 10/1989 | Huard | 361/56 |
| 5,041,889 | 8/1991 | Kriedt et al. | 361/91 |
| 5,272,371 | 12/1993 | Bishop et al. | 257/362 |
| 5,272,586 | 12/1993 | Yen | 361/111 |
| 5,276,582 | 1/1994 | Merrill et al. | 361/111 |
| 5,400,202 | 3/1995 | Metz et al. | 361/56 |
| 5,514,893 | 5/1996 | Miyanaga et al. | 257/360 |
| 5,539,327 | 7/1996 | Shigehara et al. | 326/30 |

FOREIGN PATENT DOCUMENTS

| | | |
|---|---|---|
| 0-352896 | 1/1990 | European Pat. Off. . |
| 0-492032 | 7/1992 | European Pat. Off. . |
| 0-772238 | 5/1997 | European Pat. Off. . |
| 59-181560 | 10/1984 | Japan . |

OTHER PUBLICATIONS

Ben Streetman, Solid State Electronic Devices, pp. 228–229, (No month) 1980.

Primary Examiner—Michael J. Sherry

[57] ABSTRACT

A protective circuit is disclosed for protecting an integrated circuit against electrostatic discharge, so-called ESD. The integrated circuit is connected to a supply voltage via a $V_{cc}$-pad (2) and an earth pad (3). The protective circuit, which is particularly intended to protect a positively supplied circuit for radio frequency applications against both negative and positive voltage pulses, comprises an input pad (14) and at least one PNP-transistor (20), the input pad being connected to the integrated circuit, and the PNP-transistor being connected with its collector to the input pad, and its emitter to the $V_{cc}$-pad or to the earth pad. The base of the PNP-transistor can be connected to its emitter either directly or via a resistor (24), or not be connected.

33 Claims, 5 Drawing Sheets

PROTECTIVE CIRCUIT

TECHNICAL FIELD

The present invention relates to a circuit capable of protectins against electrostatic discharge, otherwise known as ESD. The protective circuit is intended to protect an integrated circuit, especially an integrated circuit for radio frequency applications against both negative and positive voltage pulses.

DESCRIPTION OF RELATED ART

An often occurring problem with integrated circuits is the occurrence of electrostatic discharges. Static charges can be built up to high levels and the subsequent discharge can cause great damage.

Today diodes are used to protect against such ESD-pulses. In these diodes, the breakthrough voltage is relatively high. Therefore in certain cases, it is not possible to protect the circuit sufficiently effectively.

U.S. Pat. No. 5,568,346 reveals as previously known a protective circuit arranged to protect an integrated circuit against ESD-pulses, and this particular circuit comprises diodes. FIG. 1 shows an example of such a protective circuit. The integrated circuit 1 of FIG. 1 is fed with an applied voltage between a positive potential at a $V_{cc}$-pad 2 and a ground pad 3. It can be protected against ESD-pulses 6, that may be generated due to static charges at the $V_{cc}$-pad 2 or at the circuit input pad 4.

A positive ESD-pulse between the input pad 4 and the ground pad 3 will be short-circuited to the ground via the diode 5b by a main protector 7. A negative ESD-pulse will be short circuited to the ground pad 3 when the amplitude of the pulse exceeds the forward voltage drop for the diode 5a.

If an ESD-pulse would occur between the $V_{cc}$-pad 2 and the input pad, 4 the circuit is protected with the aid of the main protector. The main protector 7 can consist of a reverse biased diode. But more sophisticated transistor-based solutions are more commonly used for the main protector 7.

A problem with the above described protective circuit is that it does not permit negative input signals to be applied to the input pad 4 since signals having an amplitude that exceeds the forward voltage drop for the diode 5a will be immediately coupled to the ground pad 3. Positive signals can, however, be applied to the input pad as long as the amplitude is less than the sum of the potential $V_{cc}$ and the forward voltage drop for the diode 5b.

In order to also be able to handle negative voltage levels on the input pad, the diode 5a can be removed. However, by removing diode 5a, only negative ESD-pulses that will be short-circuited to ground are those having voltage level that is so high that the diode 5b will break down. Because this breakdown voltage is of substantial size, the integrated circuit 1 can be destroyed by most negative even at relatively low voltage levels.

SUMMARY OF THE INVENTION

One purpose of the present invention is to provide a protective circuit which, in a flexible and effective manner, protects an integrated circuit against ESD-pulses, and in particular against negative ESD-pulses at an input pad belonging to the protective circuit and connected to the integrated circuit.

An additional purpose of the invention is to provide an input pad in the protective circuit that has low resistive and capacitive losses and small coupling to the substrate.

These purposes and others are achieved with a protective circuit comprising at least one PNP-transistor with its collector connected to the input pad and its emitter connected to the $V_{cc}$-pad of the integrated circuit or to its earth pad. The protective circuit can also comprise a main protector connected between the $V_{cc}$-pad and the earth pad so arranged that protection against ESD-pulses between them is obtained. The base of the transistor can be connected to its emitter, either directly or via a resistor with a resistance. Alternatively it can be left floating, i.e. unconnected.

The PNP-transistor, which is preferably of lateral type with a predetermined distance between the collector and the emitter, can with advantage be integrated with the input pad on a common substrate doped to a first conductivity type.

The input pad can include a metal layer, preferably of octagonal shape, at least one underlying doped layer of a second conductivity type, a trench of insulating material which surrounds the underlying doped layer and a low resistive decoupling which surrounds the trench.

The low-resistive decoupling can comprise diffused substrate contacts and/or deep contacts with an electrically conducting material, such as tungsten or high-doped polysilicon, substrate contacts filled preferably by means of CVD-technology.

One advantage of the present invention is that the breakdown voltage of the ESD-protection can be adapted to a particular application by suitable selection of the resistance of the resistor and the distance between the collector and emitter of the PNP-transistor.

Additional advantages of the invention will be evident from the following description.

DESCRIPTION OF THE FIGURES

The invention will be described in more detail below with reference to the accompanying FIGS. 2–8, which are only shown to illustrate the invention and in no way limit the scope thereof.

DETAILED DESCRIPTION OF THE PREFERRED EMBODIMENTS

Figure 1:
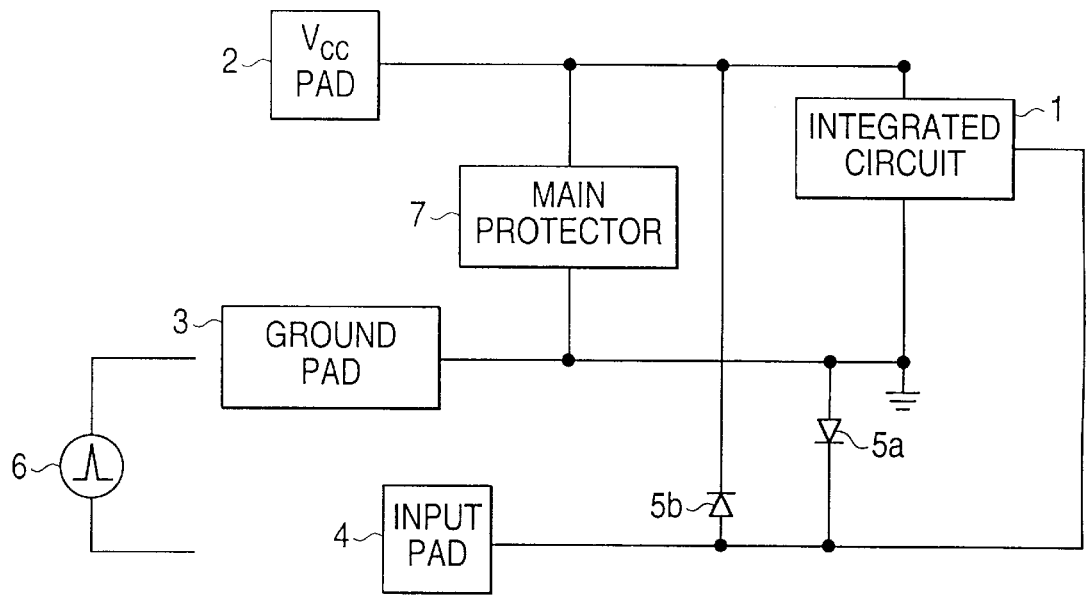
FIG. 1 shows schematically a protective circuit according to the prior art.
Figure 2:
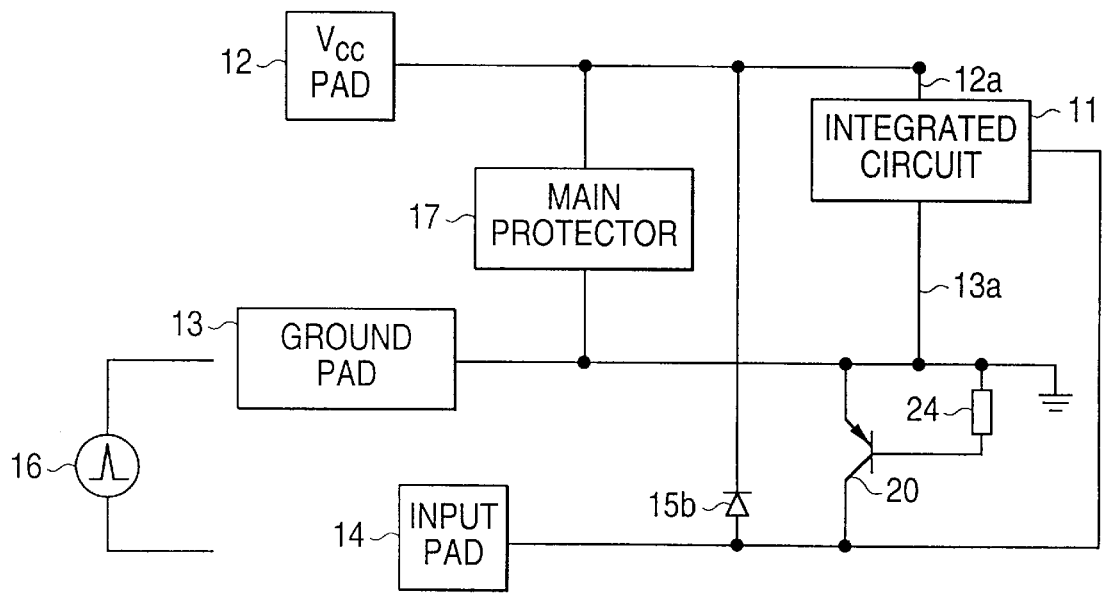
FIG. 2 shows schematically a protective circuit according to a first preferred embodiment of the present invention.

FIG. 2 shows a protective circuit according to the present invention. An integrated circuit 11 is supplied with a voltage via two conductors 12a,13a, which are interconnected to an individual pad, preferably a $V_{cc}$-pad 12 and a ground pad 13, the potential of the $V_{cc}$-pad being positive relative to the potential of the ground pad. Between these conductors, a main protector 17 can be connected, which consists a reverse biased diode or of more complex transistor-based circuits. The integrated circuit is also connected to an input pad 14.

According to the invention, a PNP-transistor 20 is included in the protective circuit, arranged such that its collector is connected to the input pad 14 and its emitter to the ground pad 13. The base of the PNP-transistor is connected via a resistor 24 to ground pad.

The PNP-transistor is intended to constitute a protector against an ESD-pulse 16 at the input pad 14 which is negative relative to the ground pad.

The transistor function itself is concentrated to the region between the emitter and the collector. Leakage currents will occur when the voltage increases between the emitter and the collector. The voltage at the base will then increase, which eventually results in the PNP-transistor beginning to conduct. When the PNP-transistor has finally begun to conduct current, the voltage difference will drop rapidly between the emitter and the collector, and the current to the base will be supplied by the high current arising between the emitter and the collector.

The voltage at which the PNP-transistor begins to conduct current depends on the resistance of the resistor 24. A properly selected resistance can provide the desired level of protection. If the resistor 24 has a variable resistance, the protective level can be adapted to the application in question.

A diode 15b can also be included in the protective circuit. This diode is connected with its cathode to the $V_{cc}$-pad and its anode to the input pad. Alternatively, the diode can be realized by an NPN-transistor which is connected with its collector to the higher potential and its base and emitter to the input pad or by a PNP-transistor which is connected with its base to the higher potential and its collector and emitter to the input pad (not shown in FIG. 2).

An additional diode can be included in the protective circuit and be connected with its cathode to the earth pad and its anode to the input pad (not shown in FIG. 2). This diode can be present at the same time as the diode 15b or constitute an alternative thereto.

Figure 3:
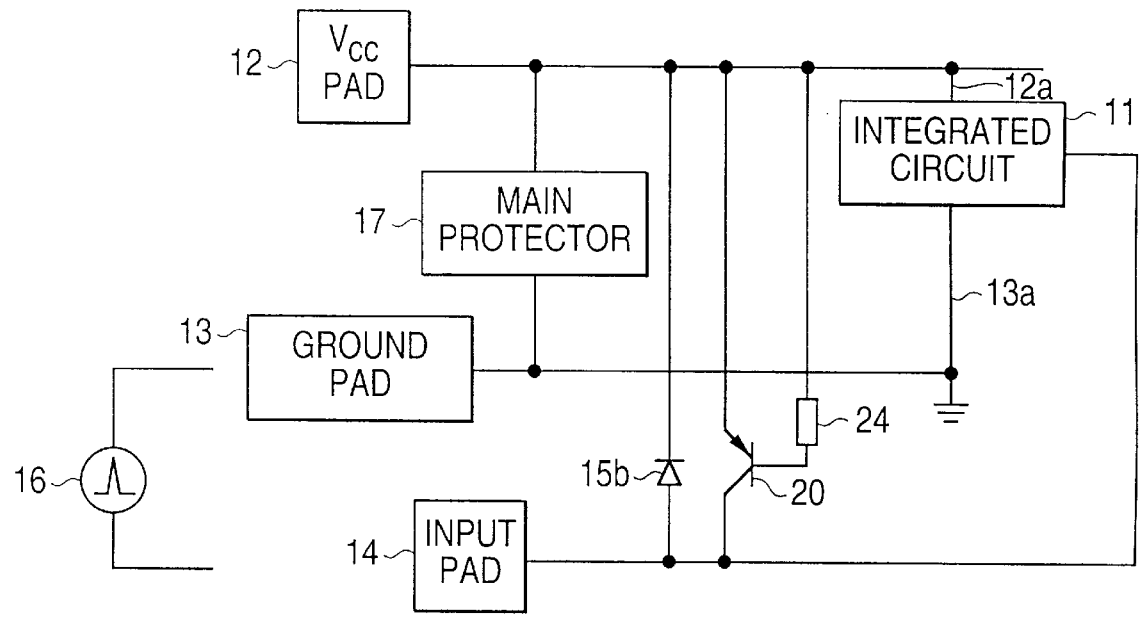
FIG. 3 shows schematically a protective circuit according to an alternative embodiment of the present invention.

FIG. 3 shows an alternative similar embodiment of the protective circuit according to the invention. The only difference in this case is that the PNP-transistor 20 is in this case arranged in such a manner that both its emitter and its base (via the resistor 24) are connected to the higher potential $V_{cc}$ instead of to the earth pad.

Figure 4:
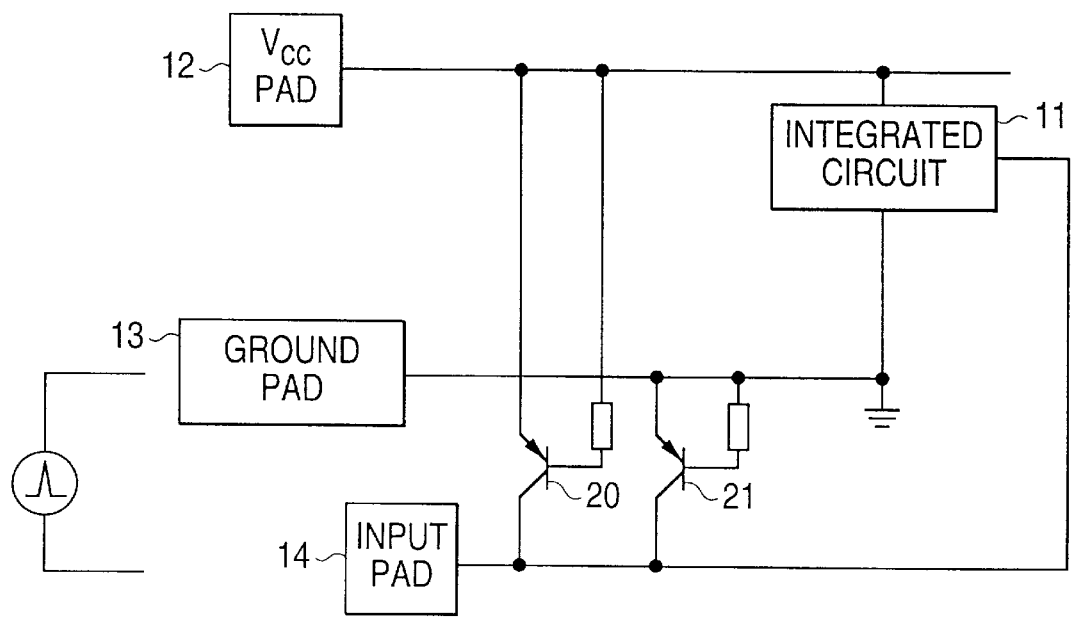
FIG. 4 shows schematically a protective circuit according to an additional alternative embodiment of the present invention.

FIG. 4 shows an additional embodiment of the present invention in which two transistors 20,21 are connected with their collectors to the input pad 14 and their emitters to the $V_{cc}$-pad 12 and the ground pad 13, respectively. This provides protection from ESD-pulses both between the input pad and the earth pad and between the input pad and the $V_{cc}$-pad without having to utilize the main protection.

One or both of the diodes described in connection with the first embodiment can be used in these two alternative embodiments (one diode 15b is shown in FIG. 3 and none in FIG. 4).

All of the embodiments can be modified such that the base of the PNP-transistor 20 can be left floating, i.e. unconnected, or it can be directly connected to the ground pad 13/$V_{cc}$-pad 12 without using a resistor (not shown in the Figures).

If the base is left floating, the breakdown $BV_{ceo}$ of the transistor 20 is used as the protective level. This level is defined by the distance between the collector and the emitter and the doping of the base.

If the resistor 24 is short-circuited, the emitter and the base of the PNP-transistor will be coupled together and the breakdown voltage will be termed $BV_{ces}$.

The PNP-transistor is preferably of lateral type that will be described briefly hereinafter with reference to FIGS. 5 and 6.

In or on a P-type semiconductor substrate 25 there lies within a predetermined area on N+ type bottom diffusion layer 27. On top of this bottom diffusion layer there lies an N-doped epi-layer 29, which is surrounded by an N+-doped base contact 31. Over the epi-layer there is grown field oxide 33 within predetermined areas, whereafter P-doped emitter 35 and collector areas 37 are achieved. On top of this there is a passivation layer 39 in which contact holes 41,43,45 are made to establish communication between the active areas and the upper metallic conducting layers 51,53,55.

Figure 5:
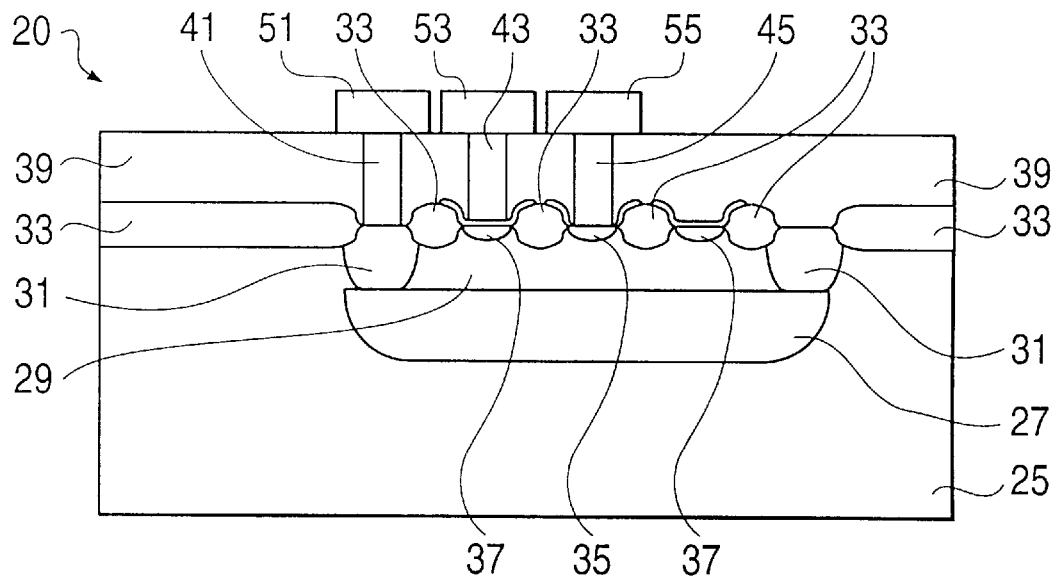
FIG. 5 shows a cross-section of a lateral PNP-transistor which is used in the inventive protective circuit.
Figure 6:
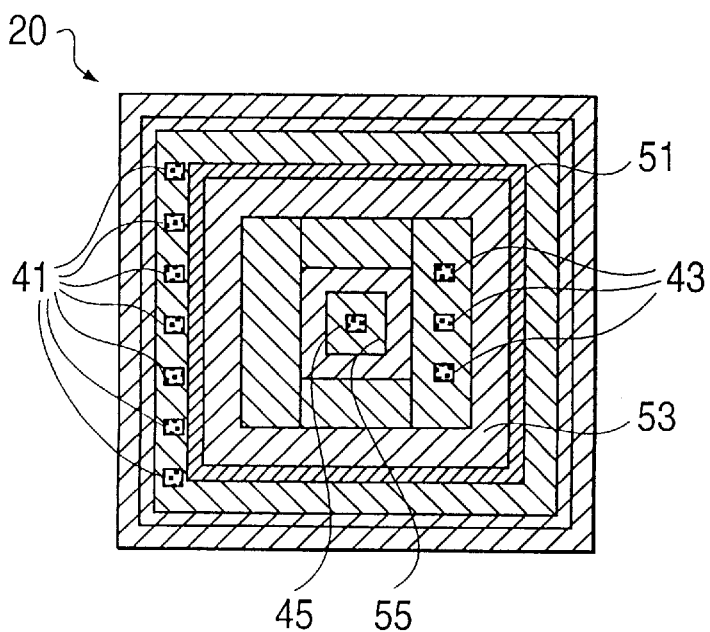
FIG. 6 shows a lateral PNP-transistor in a view from above.

FIG. 6 shows the lateral PNP-transistor 20 as seen from above. It shows the lateral extent of the metallic connecting layers 51,53,55 which connect to the base, the collector and the emitter, respectively. The contact holes 41,43,45 are also shown in the Figure. Note however that the contact holes 43 of the collector are shown at a different location in FIG. 6 than in FIG. 5.

Figure 7:
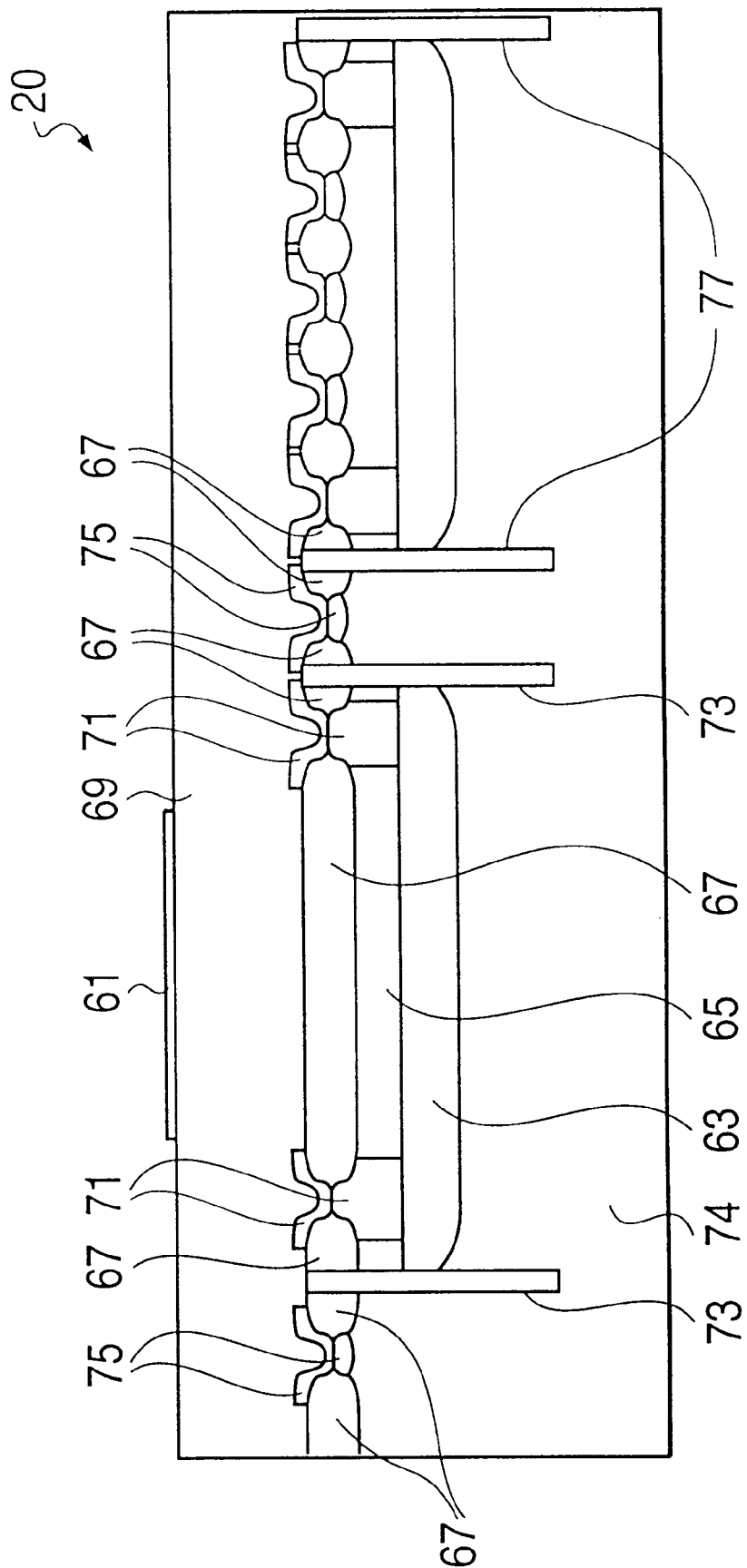
FIG. 7 shows a cross-section of a lateral PNP-transistor and an input pad which is used in the inventive protective circuit.

FIG. 7 shows a cross-section of the input pad 14 and the PNP-transistor 20 according to the invention. The input pad is provided with an upper metal layer 61 and an underlying structure comprising, among other things, an N+-diffusion layer 63 for reduction of the resistive losses which give rise to noise and thus degrade the performance of the protection in radio applications.

The underlying structure further comprises an N-doped epi-layer 65, field oxide 67, an insulating layer 69, N+-doped contacts 71 and deep trenches 73.

The signals arising between the metal layer 61 and the underlying structure can be decoupled via the N+-doped contacts 71 so that the signals will not come down into the substrate 74 where they could disturb the surroundings by, e.g., cross-talk.

The trenches 73, which are filled with an insulating material and which surround the rest of the underlying structure, further limit the above-mentioned couplings. The trenches 73 prevent the coupling in the upper adjacent surface layers from occurring with the same strength. Note that the metal layer 61 must lie within the area defined by the trenches 73.

The portion of the signal which still reaches down to the substrate is decoupled with substrate 74 contacts 75 which can consist of a series of dopings of the same type as the substrate or can consist of holes or grooves filled with a low-resistive filling, e.g. high-doped polysilicon or tungsten, which has been deposited using CVD-technology (see e.g. Swedish Patent Applications 9601119-2 and 9601444-4).

The lateral PNP-transistor 20 which is identical to the transistor shown in FIGS. 5 and 6, is also surrounded by deep trenches 77. The collector 37 of the transistor and its resistor (not shown in FIG. 7) are connected to the metal layer 61 of the input pad as close thereto as possible. Note that FIG. 7 is schematic and does not show a number of layers included in the semiconductor structure. For example, there is not shown the electrical connection between the input pad 14 and the lateral transistor 20.

Preferably, the connecting layer of the transistor 20 is localized to the first (lowermost) metal layer of the structure while the metal layer of the input pad 14 is localized to the last (topmost) metal layer of the structure.

Figure 8:
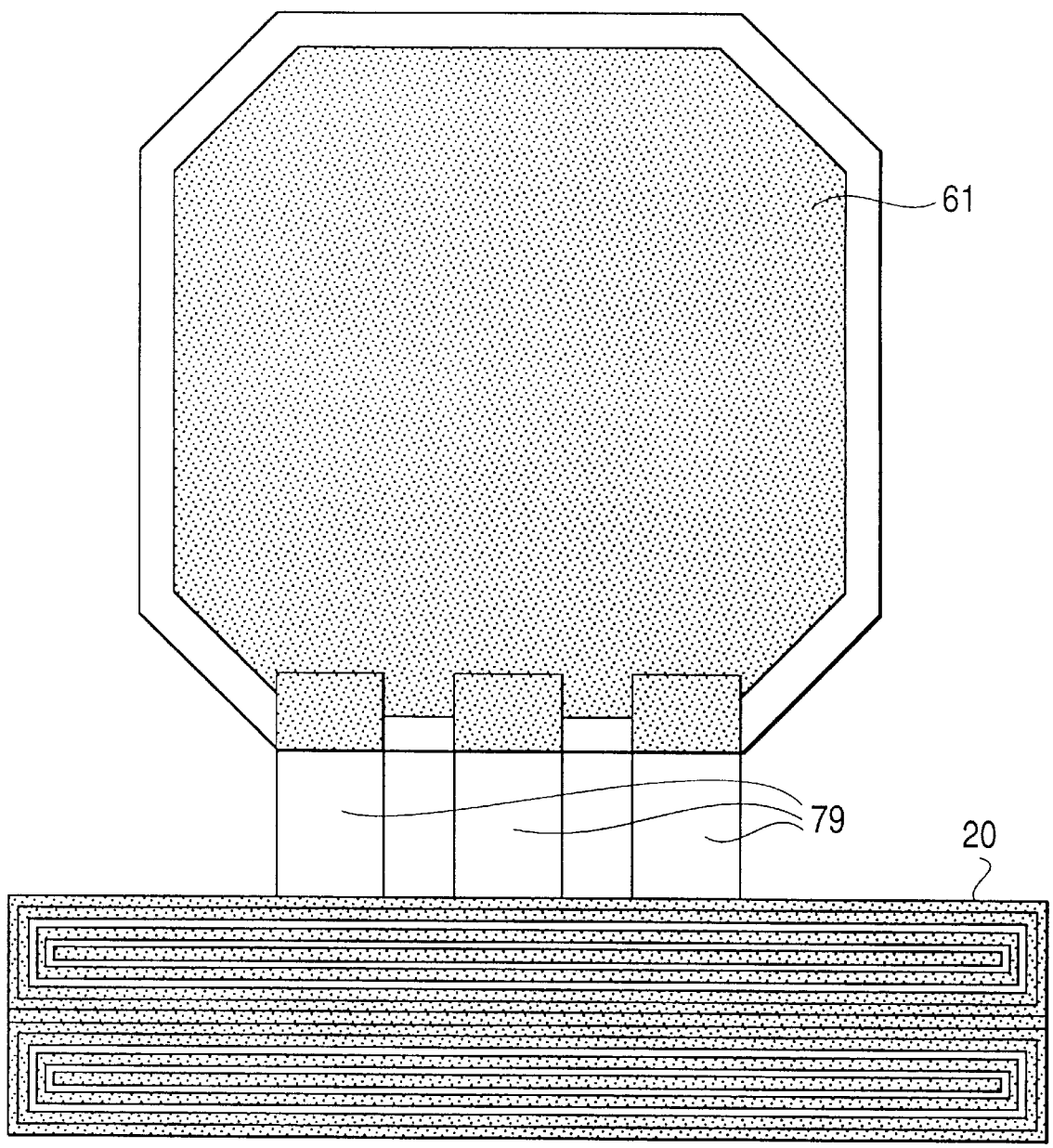
FIG. 8 shows a lateral PNP-transistor, an input pad and a connection between them, in a view from above.

FIG. 8 shows a preferred layout for the metal layer 61 of the input pad 14, the lateral PNP-transistor 20, and a connection 79 between them, as seen from above. Note that the input pad is not square but has been made octagonal to minimize the capacitive losses.

The protective circuit according to the invention is particularly suitable for protecting integrated circuits intended for radio and other high-frequency applications.

An advantage of the protective circuit according to the invention is that the breakdown voltage for the PNP-transistor 20 can be programmed within certain limits with the aid of the resistor and the distance between the collector and the emitter of the PNP-transistor 20.

The invention is, of course, not limited to the embodiments described above and shown in the drawings. Rather, it can be modified within the scope of the accompanying patent claims. The invention is obviously not limited as regards layout, dimensions or geometries of the input pad, the PNP-transistor or the protective circuit.

What is claimed is:

1. A protective circuit for protecting an integrated circuit against electrostatic discharge, said integrated circuit being connected to a supply voltage via a $V_{cc}$-pad and a ground pad, the protective circuit comprising:

an input pad connected to the integrated circuit, and at least one transistor having a collector connected to the input pad and an emitter connected to one of the $V_{cc}$-pad and the ground pad, wherein the transistor has a base that is in a floating state.

2. The protective circuit according to claim 1, further comprising:

a main protector connected between the $V_{cc}$-pad and the ground pad, the main protector being structured and arranged to protect against electrostatic discharge pulses between the $V_{cc}$-pad and the ground pad.

3. The protective circuit according to claim 1, wherein the transistor has a base that is connected to the emitter.

4. The protective circuit according to claim 3, further comprising:

a resistor having a predetermined resistance that connects the base of the transistor to the emitter.

5. The protective circuit of claim 1, wherein the transistor is connected to the Vcc-pad, the protective circuit further comprising:

a second transistor having a collector connected to the input pad and an emitter connected to the ground pad.

6. The protective circuit according to claim 1, further comprising:

at least one diode having an anode connected to the input pad and a cathode connected to the $V_{cc}$-pad.

7. The protective circuit according to claim 1, further comprising:

at least one diode having an anode connected to the input pad and a cathode connected to the ground pad.

8. The protective circuit according to claim 1, wherein the transistor is a lateral type transistor having a predetermined distance between the collector and the emitter.

9. The protective circuit according to claim 1, wherein the transistor and the input pad are integrated on a common substrate that is doped to a first conductivity type.

10. The protective circuit according to claim 1, wherein the input pad comprises:

a metal layer, at least one underlying doped layer of a second conductivity type, and a contact of said second conductivity type that is connected to the doped layer.

11. The protective circuit according to claim 10, wherein the metal layer of the input pad is octagonal in shape.

12. The protective circuit according to claim 10, wherein the input pad comprises:

a trench that surrounds the underlying doped layer and that contains an insulating material.

13. The protective circuit according to claim 12, wherein the input pad comprises:

a low-resistive decoupling with surrounds the trench.

14. The protective circuit according to claim 13, wherein the low-resistive decoupling comprises diffused substrate contacts.

15. The protective circuit according to claim 13, wherein the low-resistive decoupling comprises deep substrate contacts filled with an electrically conducting material.

16. The protective circuit according to claim 15, wherein the substrate contacts are filled using CVD-technology.

17. The protective circuit according to claim 15, wherein the electrically conducting material is one of tungsten or high-doped polysilicon.

18. The protective circuit of claim 1, wherein the emitter is connected to the Vcc-pad.

19. The protective circuit according to claim 1, wherein the emitter is connected to the ground pad.

20. The protective circuit according to claim 1, wherein the transistor is a PNP transistor.

21. The protective circuit according to claim 1, wherein the base is unconnected.

22. A protective circuit for protecting an integrated circuit ("IC") against electrostatic discharge, the package including the IC comprising a plurality of pads for electrically contacting respective features of the IC via interconnects, wherein a first interconnect connects to a Vcc pad supplying the IC with voltage, a second interconnect connects to a ground pad grounding the IC, and a third interconnect connects to an input pad inputting a signal to the IC, the protective circuit comprising:

a transistor arrangement comprising at least one transistor having a collector connected to the third interconnect and an emitter connected to one of the first and second interconnects; and a diode arrangement comprising at least one diode having an anode connected to the third interconnect and a cathode connected to one of the first and second interconnects.

23. The protective circuit of claim 22, wherein said at least one transistor having an emitter connected to the first interconnect, said transistor arrangement further comprising a second transistor having a collector connected to the third interconnect and an emitter connected to the second interconnect.

24. The protective circuit of claim 23, wherein the emitter of said first and second transistors have the same majority carrier type.

25. The protective circuit of claim 23, wherein said first and second transistors are of the PNP type.

26. The protective circuit of claim 23, wherein said at least one diode having a cathode connected to the first interconnect, said diode arrangement further comprising a second diode having an anode connected to the third interconnect and a cathode connected to the second interconnect.

27. The protective circuit of claim 22, wherein said at least one diode having a cathode connected to the first interconnect, said diode arrangement further comprising a second diode having an anode connected to the third interconnect and a cathode connected to the second interconnect.

28. The protective circuit of claim 22, wherein said at least one transistor has its base short circuited to its emitter.

29. The protective circuit of claim 22, wherein said at least one transistor has its base connected to its emitter through a variable resistor.

30. The protective circuit of claim 22, wherein said at least one transistor has its base floating.

31. The protective circuit of claim 22 further comprising:

a rectifying circuit having a first terminal connected to the first interconnect and second terminal connected to the second interconnect.

32. The protective circuit of claim 31, wherein the rectifying circuit is a reverse biased diode.

33. The protective circuit of claim 31, wherein the rectifying circuit is a transistor based circuit.

* * * * *